(12) United States Patent
Motallebi et al.

(10) Patent No.: US 8,026,035 B2
(45) Date of Patent: Sep. 27, 2011

(54) ETCH-RESISTANT DISILANE AND SATURATED HYDROCARBON BRIDGED SILICON-CONTAINING POLYMERS, METHOD OF MAKING THE SAME, AND METHOD OF USING THE SAME

(75) Inventors: Shahrokh Motallebi, Santa Clara, CA (US); SangHak Lim, San Jose, CA (US)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 882 days.

(21) Appl. No.: 11/729,839

(22) Filed: Mar. 30, 2007

(65) Prior Publication Data

US 2008/0241748 A1    Oct. 2, 2008

(51) Int. Cl.
G03F 7/09 (2006.01)
G03F 7/20 (2006.01)
G03F 7/30 (2006.01)
G03F 7/36 (2006.01)
G03C 1/825 (2006.01)

(52) U.S. Cl. ............ 430/270.1; 430/311; 430/313; 430/323; 430/325; 430/326; 430/905; 528/31; 528/34; 528/35; 528/39; 528/40; 528/41; 528/43

(58) Field of Classification Search .............. None
See application file for complete search history.

(56) References Cited

U.S. PATENT DOCUMENTS

| | | | |
|---|---|---|---|
| 5,378,790 | A | 1/1995 | Michalczyk et al. |
| 6,251,486 | B1 | 6/2001 | Chandross et al. |
| 6,420,088 | B1 | 7/2002 | Angelopoulos et al. |
| 6,423,772 | B1 | 7/2002 | Zhang et al. |
| 6,503,692 | B2 | 1/2003 | Angelopoulos et al. |
| 6,576,393 | B1 | 6/2003 | Sugita et al. |
| 6,730,454 | B2 | 5/2004 | Pfeiffer et al. |
| 6,774,202 | B2 | 8/2004 | Lee |
| 7,108,922 | B2 | 9/2006 | Lyu et al. |
| 7,833,696 | B2 * | 11/2010 | Fu et al. ............ 430/325 |
| 2003/0059550 | A1 * | 3/2003 | Nishikawa et al. ...... 427/460 |
| 2005/0049382 | A1 | 3/2005 | Lyu et al. |
| 2006/0127587 | A1 | 6/2006 | Kang et al. |
| 2007/0015892 | A1 * | 1/2007 | Nakagawa et al. ........ 528/25 |
| 2007/0197755 | A1 * | 8/2007 | Sueyoshi et al. .......... 528/15 |
| 2009/0118440 | A1 * | 5/2009 | Nakanishi et al. ........ 525/478 |

FOREIGN PATENT DOCUMENTS

| | | |
|---|---|---|
| WO | WO 2006/065316 | 6/2006 |
| WO | WO 2006/065320 | 6/2006 |
| WO | WO 2006/065321 | 6/2006 |

* cited by examiner

Primary Examiner — Sin J. Lee
(74) Attorney, Agent, or Firm — Lee & Morse, P.C.

(57) ABSTRACT

A composition includes a copolymer including a mixture of monomeric units having structures (A), (B), and (C), and one or more of structures (D) or (E):

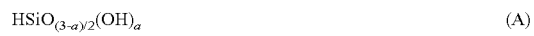

(A)

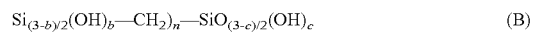

(B)

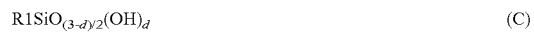

(C)

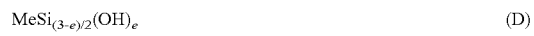

(D)

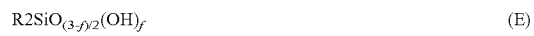

(E)

wherein a, b, c, d, e, and f are independently from 0 to 2, n is from 0 to about 10, R1 is a chromophore, and R2 is a hydrophilic group.

25 Claims, 2 Drawing Sheets

Formula 1

Formula 1

ETCH-RESISTANT DISILANE AND SATURATED HYDROCARBON BRIDGED SILICON-CONTAINING POLYMERS, METHOD OF MAKING THE SAME, AND METHOD OF USING THE SAME

BACKGROUND OF THE INVENTION

1. Field of the Invention

The present invention rebates to etch-resistant disilane and saturated hydrocarbon bridged silicon-containing polymers, a method of making the same, and a method of using the same. More particularly, the present invention relates to etch-resistant disilane and saturated hydrocarbon bridged silicon-containing polymers, a method of making the same, and a method of using the same that may be employed in a photolithographic manufacturing process.

2. Description of the Related Art

The manufacture of devices such as semiconductor devices, optoelectronic devices, MEMS devices, etc., generally employs micromachining operations that incorporate photolithographic processes. The photolithographic processes may employ light of a predetermined wavelength suitable for forming an image having a desired resolution. It is generally advantageous to reduce a size of features in the devices for a variety of reasons such as economic savings, performance advantages, reduction in size of the overall device, etc. However, reducing feature sizes may require advances in the manufacturing process in order to maintain product yields, limit process variances, etc. Further, reduced feature sizes may require the implementation of new materials for device features, which may present additional problems.

For example, a feature formed using a photolithographic process may not be formed with a satisfactory amount of control over critical dimensions as the size of the feature is reduced. In particular, light used to expose a photoresist formed on a layer may reflect from the layer and/or layer interfaces, resulting in a lack of precision in the exposure process. Accordingly, it may be desirable to employ an antireflective material under the photoresist. Such a material may need to exhibit not only antireflective properties, but a suitable etch selectivity with respect to the photoresist as well. However, many such antireflective materials exhibit properties substantially similar to those of the photoresist, which limits their usefulness.

SUMMARY OF THE INVENTION

The present invention is therefore directed to etch-resistant disilane and saturated hydrocarbon bridged silicon-containing polymers, a method of making the same, and a method of using the same.

It is therefore a feature of an embodiment of the present invention to provide disilane and saturated hydrocarbon bridge siloxane copolymers that include a silylhydride moiety and a chromophore.

It is therefore another feature of an embodiment of the present invention to provide copolymers suitable for use as antireflective coatings under a photoresist.

It is therefore a further feature of an embodiment of the present invention to provide copolymers having an etch selectivity with respect to an organic photoresist.

At least one of the above and other features and advantages of the present invention may be realized by providing a composition, including a copolymer including a mixture of monomeric units having structures (A), (B), and (C), and one or more of structures (D) or (E):

  (A)

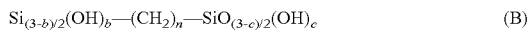  (B)

  (C)

  (D)

  (E)

wherein a, b, c, d, e, and f are independently from 0 to 2, n is from 0 to about 10, R1 is a chromophore, and R2 is a hydrophilic group.

The copolymer may include monomeric units having the structures (A), (B), (C), (D), and (E). n may be 0. n may be 1 or 2. R1 may include one or more of a phenyl group or a substituted phenyl group. R2 may include one or more of an aliphatic alcohol, a cycloaliphatic alcohol, an ether, or an ester.

The copolymer may have a weight average molecular weight of about 1,000 to about 100,000. The composition may be an antireflective coating for lithography, the composition may include about 0.1% to about 20% of the copolymer, based on the total weight of the composition, and the composition may include about 80% to about 99.9% of a solvent, based on the total weight of the composition.

The copolymer may be a hydrolysate and/or condensate of four or five monomers that respectively correspond to the monomeric units having the structures (A), (B), and (C), and (D) and/or (E). The monomers that respectively correspond to the monomeric units having the structures (A) and (C), and (D) and/or (E) may be chlorosilane monomers, and the monomer that corresponds to the monomeric unit having the structure (B) may be an alkoxysilane monomer or a chlorosilane monomer.

At least one of the above and other features and advantages of the present invention may also be realized by providing a method of forming a copolymer, including hydrolyzing and/or condensing a first monomer, a second monomer, a third monomer, and a fourth monomer to form a siloxane, wherein each of the first, second, third and fourth monomers contains silicon, the first monomer includes a silylhydride group, the second monomer includes one or more of a disilane group, or a group having two silicon atoms bridged by a saturated hydrocarbon bridge, the third monomer includes a chromophore, and the fourth monomer includes one or more of a methyl group, or a hydrophilic group.

The condensed first monomer may have a structure (A):

  (A), wherein a is from 0 to 2. The first monomer may be trichlorosilane, trimethoxysilane, or triethoxysilane.

The condensed second monomer may have a structure (B):

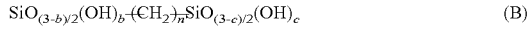  (B)

b and c may be independently from 0 to 2, and n may be from 0 to about 10. The second monomer may include the disilane group. The second monomer may be hexaethoxydisilane, hexachlorodisilane, pentaethoxydisilane, pentachlorodisilane, pentaethoxymethyldisilane, pentachloromethyldisilane, tetraethoxydisilane, tetrachlorodisilane, tetraethoxydimethyldisilane, tetrachlorodimethyldisilane, triethoxydisilane, trichlorodisilane, triethoxytrimethyldisilane, or trichlorotrimethyldisilane. The second monomer may include the group having the two silicon atoms bridged by the saturated hydrocarbon bridge.

The group having the two silicon atoms bridged by the saturated hydrocarbon bridge may be —Si—CH$_2$)$_n$—Si—, and n may be from 1 to about 10. The second monomer may be 1,2-bis(trichlorosilyl)ethane, 1,2-bis(triethoxysilyl)ethane, bis(trichlorosilyl)methane, bis(triethoxysilyl)methane, 1,2-bis(methyldichlorosilyl)ethane, or 1,2-bis(methyldiethoxysilyl)ethane.

The condensed third monomer may have a structure (C):

d may be from 0 to 2, and R1 may be the chromophore.

The chromophore may include one or more of a phenyl group or a substituted phenyl group. The third monomer may be phenyltrichlorosilane, phenyltriethoxysilane, or phenyltrimethoxysilane.

The condensed fourth monomer may have a structure (D) or (E):

e and f may be independently from 0 to 2, and R2 may be the hydrophilic group. The fourth monomer may be methyltrichlorosilane, methyltrimethoxysilane, methyltriethoxysilane, 2-[methoxy(polyethyleneoxy)propyl]trichlorosilane, 2-[methoxy(polyethyleneoxy)propyl]trimethoxysilane, 2-[methoxy(polyethyleneoxy)propyl]triethoxysilane, 2-[methoxy(polypropyleneoxy)propyl]trichlorosilane, 2-[methoxy(polypropyleneoxy)propyl]trimethoxysilane, 2-[methoxy(polypropyleneoxy)propyl]triethoxysilane, 2-[methoxy(copolyethyleneoxypropyleneoxy)propyl]trichlorosilane, 2-[methoxy(copolyethyleneoxypropyleneoxy)propyl]trimethoxysilane, 2-[methoxy(copolyethyleneoxypropyleneoxy)propyl]triethoxysilane 2-(carbomethoxy)ethyltrichlorosilane, 2-(carbomethoxy)ethyltrimethoxysilane, 2-(carbomethoxy)ethyltriethoxysilane, 2-(carbo t-butoxy)propyltrichlorosilane, 2-(carbo t-butoxy)propyltrimethoxysilane, 2-(carbo t-butoxy)propyltriethoxysilane, hydroxymethyltrichlorosilane, hydroxymethyltrimethoxysilane, hydroxymethyltriethoxysilane, 2,2-diethoxy-4-methyl-[1,2]oxasilolane, 2,2-diethoxy-4-methyl-[1,2]oxasililane, 2,2-diethoxy-4-methyl-[1,2]oxasilepane, 2,2-diethoxy-[1,2]oxasilolane, 2,2-diethoxy-[1,2]oxasililane, or 2,2-diethoxy-[1,2]oxasilepane. The fourth monomer may include the methyl group, and the mixture may further include a fifth monomer having a hydrophilic group.

The fourth monomer may include the hydrophilic group, and the hydrophilic group may include one or more of an aliphatic alcohol, a cycloaliphatic alcohol, an ether, or an ester. The first, third, and fourth monomers may be chlorosilane monomers, and the second monomer is an alkoxysilane monomer or a chlorosilane monomer.

At least one of the above and other features and advantages of the present invention may further be realized by providing a method of forming a device, including coating a composition on a substrate to form a first material layer, forming a photoresist layer on the first material layer, patterning the photoresist layer to expose a portion of the first material layer, removing the exposed portion of the first material layer to expose a portion of the substrate, and etching the exposed portion of the substrate, wherein the composition includes a mixture of monomeric units having structures (A), (B), and (C), and one or more of structures (D) or (E):

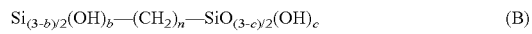

wherein a, b, c, d, e, and f are independently from 0 to 2, n is from 0 to about 10, R1 is a chromophore, and R2 is a hydrophilic group.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
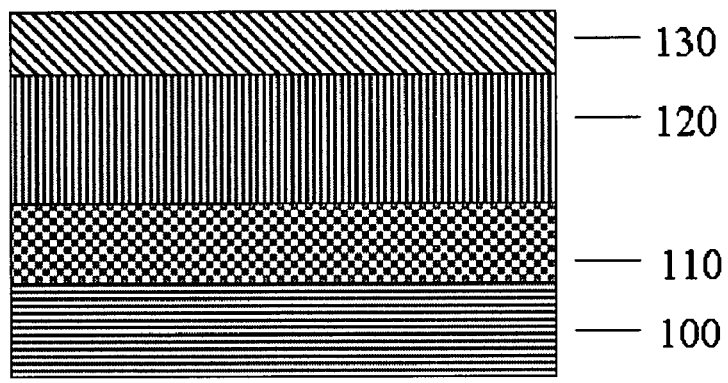
FIGS. 1A-1C illustrate stages in a method of forming a device using a photolithographic process according to an embodiment of the present invention.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
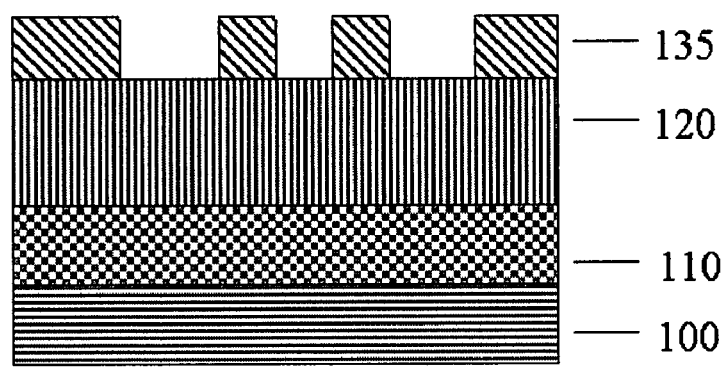
Figure 1C:
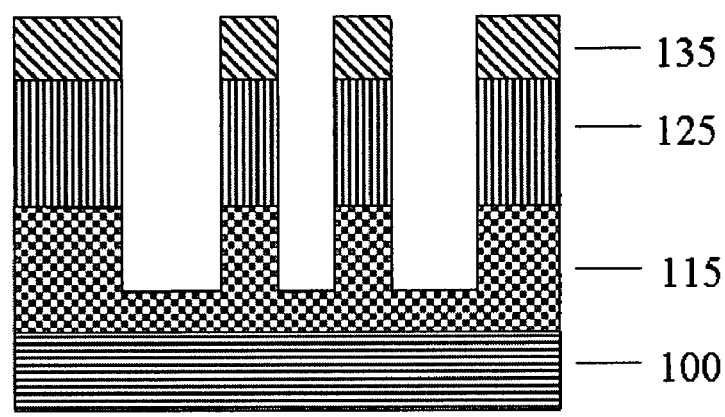

FIGS. 1A-1C illustrates stages in a method of forming a device using a photolithographic process according to an embodiment of the present invention. The device may be, e.g., a semiconductor device, an optoelectronic device, a MEMS device, etc. Referring to FIG. 1A, a substrate 100 may have a target material layer 110 disposed thereon. The photolithographic process may be used to pattern the target material layer 110 to form features having a desired resolution. A silicon-containing polymer layer 120 may be formed on the target material layer 110, and a photoresist layer 130 may be formed on the silicon-containing polymer layer 120.

The photolithographic process may include exposing the photoresist layer 130 to light having a predetermined wavelength, e.g., using an exposure mask (not shown). The wavelength of the light may be, e.g., 248 nm or 193 nm. The photoresist layer 130 may then be developed to remove an exposed or unexposed portion of the photoresist layer 130, depending on the nature of the photoresist employed. Referring to FIG. 1B, exposing and developing the photoresist layer 130 may yield a photoresist pattern 135 on the silicon-containing polymer layer 120. The photoresist pattern 135 may then be used as an etch mask to pattern the underlying silicon-containing polymer layer 120 and the target material layer 110, thereby forming a patterned silicon-containing polymer layer 125 and a patterned target material layer 115, as shown in FIG. 1C.

In an implementation, the silicon-containing polymer layer 120 may be patterned using the photoresist pattern 135 as an etch mask, and the patterned silicon-containing polymer layer 125 formed thereby may then be employed as a hardmask for patterning the target material layer 110.

The silicon-containing polymer layer 120 may be formed from a composition that includes a copolymer and a solvent. The composition may be applied as, e.g., a spin-on coating. The application of the composition may further include a low temperature curing operation.

The weight average molecular weight of the copolymer in the composition may be about 1,000 to about 100,000. The composition may include the copolymer in a range of about 0.1% to about 20%, based on the total weight of the composition. The composition may include the solvent in a range of 80% to about 99.9%, based on the total weight of the composition, although other materials may also be present.

In an embodiment of the present invention, the copolymer may include a mixture of monomeric units (A), (B), and (C), and one or both of monomeric units (D) and (E), having structures as shown below:

  (A)

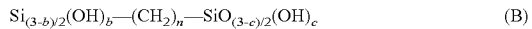  (B)

  (C)

  (D)

  (E)

wherein a, b, c, d, e, and f may be independently 0 to 2. In monomeric unit (B), n may be from 0 to about 10. In monomeric unit (C), R1 may be a chromophore. The chromophore may absorb light having a wavelength of, e.g., 248 nm or 193 nm. In an implementation, R1 may include one or more of phenyl (—$C_6H_5$) or substituted phenyl groups. In monomeric unit (E), R2 may be a moiety having hydrophilic properties. In an implementation, R2 may include one or more of a moiety such as an aliphatic or cycloaliphatic alcohol, a moiety such as an ether having the formula —$(CH_2)_p(O(CH_2)_q)_rOR3$, wherein p may be from 1 to about 10, q may be at least 1, r may be from 0 to about 10, and R3 may be a saturated or unsaturated $C_1$-$C_{20}$ hydrocarbon, an ester having the formula —$(CH_2)_sCOOR3$, wherein s may be at least 1 and R3 may be a saturated or unsaturated $C_1$-$C_{20}$ hydrocarbon, or an ester having the formula —$(CH_2)_tOCOR3$, wherein t may be at least 1 and R3 may be a saturated or unsaturated $C_1$-$C_{20}$ hydrocarbon.

Figure 2:
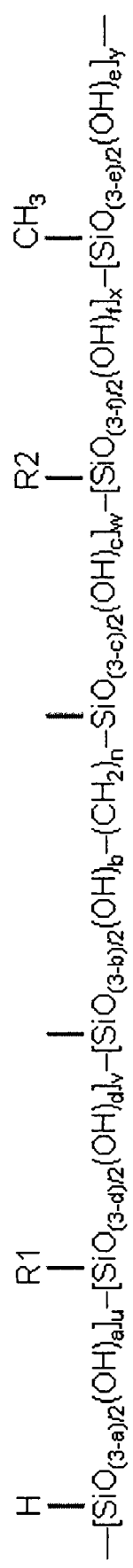
FIG. 2 illustrates Formula 1, a generalized copolymer formula according to an embodiment of the present invention.

FIG. 2 illustrates Formula 1, a generalized copolymer formula according to an embodiment of the present invention. The relative amounts of the monomeric units A-E will now be described in connection with Formula 1. It will be understood, however, that Formula 1 is not intended to represent the precise structure of the copolymer, which may be a complex, irregular, cross-linked structure. Therefore, the copolymer according to the present invention is not to be interpreted as being limited to Formula 1. Rather, Formula 1 is provided merely for the purpose of providing a clear description of the relative proportions of monomeric units that may be present in the copolymer.

In Formula 1, R1, R2, a, b, c, d, e, and f are as described above in connection with monomeric units (A), (B), (C), (D), and (E). Referring to Formula 1, u may be greater than 0 and less than or equal to 1−(v+w+x+y), v may be greater than 0 and less than or equal to 1−(u+w+x+y), w may be greater than 0 and less than or equal to 1−(u+v+x+y), x may be equal to or greater than 0 and less than or equal to 1−(u+v+w+y), y may be equal to or greater than 0 and less than or equal to 1−(u+v+w+x), and one or more of x or y may be greater than 0. Further, other components may also be present, i.e., u+v+w+x+y may be less than 1.

In Formula 1, n may be from 0 to about 10. In an implementation, the copolymer may have a disilane moiety and n may be 0. In another implementation, the copolymer may have silicon atoms bridged by a saturated hydrocarbon bridge, e.g., a bridge of n methylene units, and n may be from 1 to about 10. The copolymer may further include a silylhydride moiety.

The copolymer may have relatively large silicon content, e.g., about 20 to about 46% silicon, and may exhibit an enhanced etch resistance, and the composition including the copolymer may exhibit a low contact angle. The composition may be applied to a target material layer, e.g., by spin coating, may be cured by heating at a relatively low temperature, and may exhibit a high storage stability at room temperature.

In an embodiment of the present invention, the copolymer may be prepared by hydrolysis and/or condensation of first, second, and third monomers corresponding to monomeric units (A), (B), and (C), respectively, and one or more of a fourth or a fifth monomer corresponding monomeric units (C) or (D), respectively. The condensation reaction may include the addition of water. The first monomer may include a silylhydride moiety. The first monomer may be, e.g., trichlorosilane, trimethoxysilane, or triethoxysilane.

The second monomer may include a disilane moiety or a bridged silicon moiety having a methylene bridge of 1 to about 10 units. The second monomer may be, e.g., hexaethoxydisilane, 1,2-bis(trichlorosilyl)ethane, 1,2-bis(triethoxysilyl)ethane, bis(trichlorosilyl)methane, bis(triethoxysilyl)methane, 1,2-bis(methyldichlorosilyl)ethane, or 1,2-bis(methyldiethoxysilyl)ethane.

The third monomer may include a chromophore-substituted silicon moiety.

The chromophore may include one or more of a phenyl group or a substituted phenyl group. The third monomer may be, e.g., phenyltrichlorosilane, phenyltriethoxysilane, or phenyltrimethoxysilane.

The fourth monomer may include a methylsilicon moiety. The fourth monomer may be, e.g., methyltrichlorosilane, methyltrimethoxysilane, or methyltriethoxysilane.

The fifth monomer may include silicon substituted with a hydrophilic substituent. The hydrophilic substituent may be R2, as described above in connection with monomeric unit (E). The fifth monomer may be, e.g., 2-[methoxy(polyethyleneoxy)propyl]trichlorosilane, 2-[methoxy(polyethyleneoxy)propyl]trimethoxysilane, 2-[methoxy(polyethyleneoxy)propyl]triethoxysilane, 2-[methoxy(polypropyleneoxy)propyl]trichlorosilane, 2-[methoxy(polypropyleneoxy)propyl]trimethoxysilane, 2-[methoxy(polypropyleneoxy)propyl]triethoxysilane, 2-[methoxy(copolyethyleneoxypropyleneoxy)propyl]trichlorosilane, 2-[methoxy(copolyethyleneoxypropyleneoxy)propyl]trimethoxysilane, 2-[methoxy(copolyethyleneoxypropyleneoxy)propyl]triethoxysilane 2-(carbomethoxy)ethyltrichlorosilane, 2-(carbomethoxy)ethyltrimethoxysilane, 2-(carbomethoxy)ethyltriethoxysilane, 2-(carbo t-butoxy)propyltrichlorosilane, 2-(carbo t-butoxy)propyltrimethoxysilane, 2-(carbo t-butoxy)propyltriethoxysilane, hydroxymethyltrichlorosilane, hydroxymethyltrimethoxysilane, hydroxymethyltriethoxysilane, 2,2-diethoxy-4-methyl-[1,2]oxasilolane, 2,2-diethoxy-4-methyl-[1,2]oxasililane, 2,2-diethoxy-4-methyl-[1,2]oxasilepane, 2,2-diethoxy-[1,2]oxasilolane, 2,2-diethoxy-[1,2]oxasililane, or 2,2-diethoxy-[1,2]oxasilepane.

The hydrolysis and condensation of chlorosilanes may produce resin materials in a shorter process time (hours versus days). The materials produced from chlorosilane hydrolysis may show uniformity in structural complexity, good shelf life stability and easiness in thermal curing.

The first, second, third, and fourth and/or fifth monomers may be mixed in a suitable solvent and hydrolyzed to induce polymerization, e.g., by the controlled addition of water under an inert atmosphere. Following the polymerization, residual water and/or volatile byproducts may be removed, e.g., using a vacuum (low pressure) atmosphere. The polymerized product may be dissolved in a suitable solvent and stored.

In a first exemplary preparation, the copolymer was prepared by forming a mixture of 1,2-bis(triethoxysilyl)ethane (17.18 g, 48.45 mmoles), phenyltrichlorosilane (5.12 g, 24.2 mmoles), methyltrichlorosilane (16.29 g, 10.9 mmoles) and trichlorosilane (6.56 g, 48.4 mmoles) in ethyl acetate (280 g). A solution of water (9.59 g, 53.27 mmoles) in ethyl acetate (41.3 g) and ethanol (45.0 g) was added to the mixture at 25° C. with stirring under a nitrogen atmosphere. The mixture was then heated to 40° C. and stirred at this temperature for 120 min.

The resulting mixture was then cooled to 25° C. and washed with water. Residual water and volatiles were removed under a vacuum. The resulting material was diluted in propylene glycol monomethyl ether acetate to produce a 5% solution of the copolymer in propylene glycol monomethyl ether acetate, and this solution was stored at 10° C. Outcome of the first exemplary preparation:

Theoretical % Si=36.2; Chemical yield=97%; Mw=13400 Daltons; PD=2.29.

In a second exemplary preparation, the copolymer was prepared by forming a mixture of 1,2-bis(triethoxysilyl)ethane (34.35 g, 96.9 mmoles), phenyltrichlorosilane (10.25 g, 48.45 mmoles), methyltrichlorosilane (32.58 g, 217.9 mmoles) and trichlorosilane (13.12 g, 96.86 mmoles) in ethyl acetate (140 g). A solution of water (19.2 g, 106.7 mmoles) in ethyl acetate (82.6 g) and ethanol (90.0 g) was added to the mixture at 25° C. with stirring under nitrogen atmosphere. The mixture was then heated to 40° C. and stirred at this temperature for 120 min.

The resulting mixture was poured into hexane and the resulting polymer was separated and dissolved in propylene glycol monomethyl ether acetate to produce a 5% solution of the copolymer in propylene glycol monomethyl ether acetate, and this solution was stored at 10° C. Outcome of the second exemplary preparation:

Theoretical % Si=36.0; Chemical yield=74%; Mw=22500 Daltons; PD=1.97.

In a third exemplary preparation, the copolymer was prepared by forming a mixture of 1,2-bis(triethoxysilyl)ethane (42.55 g, 120 mmoles), phenyltrichlorosilane (6.35 g, 30 mmoles), methyltrichlorosilane (8.97 g, 60 mmoles) and trichlorosilane (12.2 g, 90 mmoles) in propylene glycol monomethyl ether acetate (250 g). Water in propylene glycol monomethyl ether acetate (12 g in 238 g) was added to the mixture at 25° C. with stirring under a nitrogen atmosphere. The mixture was then heated to 40° C. and stirred at this temperature for 120 min.

The resulting mixture was then cooled to 25° C. and washed with water. Residual water and volatiles were removed under a vacuum. The resulting material was diluted in propylene glycol monomethyl ether acetate to produce a 5% solution of the copolymer in propylene glycol monomethyl ether acetate, and this solution was stored at 10° C. Outcome of the third exemplary preparation:

Theoretical % Si=41.3; Chemical yield=98%; Mw=13500 Daltons; PD=2.64.

In a fourth exemplary preparation, the copolymer was prepared by forming a mixture of hexaethoxydisilane (9.8 g, 30 mmoles), phenyltrichlorosilane (6.35 g, 30 mmoles), methyltrichlorosilane (22.42 g, 150 mmoles) and trichlorosilane (12.2 g, 90 mmoles) in propylene glycol monomethyl ether acetate (245 g). Water in propylene glycol monomethyl ether acetate (12 g in 238 g) was added to the mixture at 18° C. with stirring under nitrogen atmosphere. The mixture was then heated to 23° C. and stirred at this temperature for 120 min.

The resulting mixture was then washed with water. Residual water and volatiles were removed under a vacuum. The resulting material was diluted in propylene glycol monomethyl ether acetate to produce a 5% solution of the copolymer in propylene glycol monomethyl ether acetate, and this solution was stored at 10° C. Outcome of the fourth exemplary preparation:

Theoretical % Si=42.4; Chemical yield=77%; Mw=16900 Daltons; PD=2.58.

In a fifth exemplary preparation, the copolymer was prepared by forming a mixture of bis(trichlorosilyl) methane (8.49 g, 30 mmoles), phenyltrichlorosilane (6.35 g, 30 mmoles), methyltrichlorosilane (26.91 g, 180 mmoles) and trichlorosilane (8.13 g, 60 mmoles) in propylene glycol monomethyl ether acetate (257 g). Water in propylene glycol monomethyl ether acetate (12 g in 238 g) was added to this mixture at 18° C. with stirring under nitrogen atmosphere. The mixture was then heated to 23° C. and stirred at this temperature for 120 min.

The resulting mixture was then washed with water. Residual water and volatiles were removed under vacuum. The resulting material was diluted in propylene glycol monomethyl ether acetate to produce a 5% solution of the copolymer in propylene glycol monomethyl ether acetate, and this solution was stored at 10° C. Outcome of the fifth exemplary preparation:

Theoretical % Si=41.6; Chemical yield=50%; Mw=16000 Daltons; PD=1.71.

In a sixth exemplary preparation, the copolymer was prepared by forming a mixture of 1,2-bis(methyldichlorosilyl)ethane (7.68 g, 30 mmoles), phenyltrichlorosilane (6.35 g, 30 mmoles), methyltrichlorosilane (22.42 g, 150 mmoles) and trichlorosilane (12.19 g, 90 mmoles) in propylene glycol monomethyl ether acetate (310 g). Water in propylene glycol monomethyl ether acetate (12 g in 238 g) was added to the mixture at 18° C. with stirring under nitrogen atmosphere. The mixture was then heated to 23° C. and stirred at this temperature for 120 min.

The resulting mixture was then washed with water. Residual water and volatiles were removed under vacuum. The resulting material was diluted in propylene glycol monomethyl ether acetate to produce a 5% solution of the copolymer in propylene glycol monomethyl ether acetate, and this solution was stored at 10° C. Outcome of the sixth exemplary preparation:

Theoretical % Si=39.2; Mw=14400 Daltons; PD=2.03.

In a seventh exemplary preparation, the copolymer was prepared by forming a mixture of 1,2-bis(triethoxysilyl)ethane (38.7 g, 109.1 mmoles), phenyltrichlorosilane (5.8 g, 27.4 mmoles), methyltrichlorosilane (6.95 g, 46.5 mmoles), 2-[methoxy(polyethyleneoxy)propyl]trichlorosilane (5.53 g, 16.3 mmoles) and trichlorosilane (11.2 g, 82.7 mmoles) in propylene glycol monomethyl ether acetate (246 g). Water in propylene glycol monomethyl ether acetate (10.8 g in 206 g) was added to the mixture at 25° C. with stirring under nitrogen atmosphere. The mixture was then heated to 40° C. and stirred at this temperature for 180 min.

The resulting mixture was then cooled to 25° C. and washed with water. Residual water and volatiles were removed under vacuum. The resulting material was diluted in propylene glycol monomethyl ether acetate to produce a 5% solution of the copolymer in propylene glycol monomethyl ether acetate, and this solution was stored at 10° C. Outcome of the seventh exemplary preparation:

Theoretical % Si=38.9; Chemical yield=98%; Mw=19000 Daltons; PD=2.41.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A composition, comprising:
a copolymer including a mixture of monomeric units having structures (A), (B), and (C), and one or more of structures (D) or (E):

 (A)

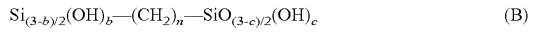 (B)

 (C)

 (D)

 (E)

wherein:
a, b, c, d, e, and f are independently from 0 to 2,
n is from 0 to about 10,
R1 is a chromophore,
R2 is a hydrophilic group,
the copolymer includes the monomeric unit having the structure (E), and
R2 includes one or more of an aliphatic alcohol, a cycloaliphatic alcohol, an ether, or an ester.

2. The composition as claimed in claim 1, wherein the copolymer includes monomeric units having the structures (A), (B), (C), (D), and (E).

3. The composition as claimed in claim 1, wherein n is 0.

4. The composition as claimed in claim 1, wherein n is 1 or 2.

5. The composition as claimed in claim 1, wherein R1 includes one or more of a phenyl group or a substituted phenyl group.

6. The composition as claimed in claim 1, wherein the copolymer has a weight average molecular weight of about 1,000 to about 100,000.

7. The composition as claimed in claim 1, wherein:
the composition is an antireflective coating for lithography,
the composition includes about 0.1% to about 20% of the copolymer, based on the total weight of the composition, and
the composition includes about 80% to about 99.9% of a solvent, based on the total weight of the composition.

8. The composition as claimed in claim 1, wherein the copolymer is a hydrolysate and/or condensate of four or five monomers that respectively correspond to the monomeric units having the structures (A), (B), and (C), and (D) and/or (E).

9. The composition as claimed in claim 8, wherein:
the monomers that respectively correspond to the monomeric units having the structures (A), and (C), and (D) and/or (E) are chlorosilane monomers, and
the monomer that corresponds to the monomeric unit having the structure (B) is an alkoxysilane monomer or a chlorosilane monomer.

10. A method of forming a copolymer, comprising:
hydrolyzing and/or condensing a first monomer, a second monomer, a third monomer, and a fourth monomer to form a siloxane, wherein:
each of the first, second, third and fourth monomers contains silicon,
the first monomer includes a silylhydride group,
the second monomer includes one or more of:
a disilane group, or
a group having two silicon atoms bridged by a saturated hydrocarbon bridge,
the third monomer includes a chromophore,
the fourth monomer includes one or more of:
a methyl group, or
a hydrophilic group,
the fourth monomer includes at least the hydrophilic group, the hydrophilic group forming part of the siloxane, and
the hydrophilic group includes one or more of an aliphatic alcohol, a cycloaliphatic alcohol, an ether, or an ester.

11. The method as claimed in claim 10, wherein:
the condensed first monomer has a structure (A):

 (A), and
a is from 0 to 2.

12. The method as claimed in claim 10, wherein the first monomer is trichlorosilane, trimethoxysilane, or triethoxysilane.

13. The method as claimed in claim 10, wherein:
the condensed second monomer has a structure (B):

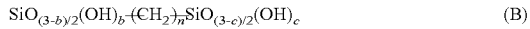 (B)

b and c are independently from 0 to 2, and
n is from 0 to about 10.

14. The method as claimed in claim 10, wherein the second monomer includes the disilane group.

15. The method as claimed in claim 14, wherein the second monomer is hexaethoxydisilane, hexachlorodisilane, pentaethoxydisilane, pentachlorodisilane, pentaethoxymethyldisilane, pentachloromethyldisilane, tetraethoxydisilane, tetrachlorodisilane, tetraethoxydimethyldisilane, tetrachlorodimethyldisilane, triethoxydisilane, trichlorodisilane, triethoxytrimethyldisilane, or trichlorotrimethyldisilane.

16. The method as claimed in claim 10, wherein the second monomer includes the group having the two silicon atoms bridged by the saturated hydrocarbon bridge.

17. The method as claimed in claim 16, wherein:
the group having the two silicon atoms bridged by the saturated hydrocarbon bridge is:
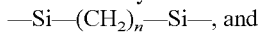, and
n is from 1 to about 10.

18. The method as claimed in claim 16, wherein the second monomer is 1,2-bis(trichlorosilyl)ethane, 1,2-bis(triethoxysilyl)ethane, bis(trichlorosilyl)methane, bis(triethoxysilyl)methane, 1,2-bis(methyldichlorosilyl)ethane, or 1,2-bis(methyldiethoxysilyl)ethane.

19. The method as claimed in claim 10, wherein:
the condensed third monomer has a structure (C):

$$R1SiO_{(3-d)/2}(OH)_d \quad (C),$$

d is from 0 to 2, and
R1 is the chromophore.

20. The method as claimed in claim 10, wherein the chromophore includes one or more of a phenyl group or a substituted phenyl group.

21. The method as claimed in claim 20, wherein the third monomer is phenyltrichlorosilane, phenyltriethoxysilane, or phenyltrimethoxysilane.

22. A method of forming a copolymer, comprising:
hydrolyzing and/or condensing a first monomer, a second monomer, a third monomer, and a fourth monomer to form a siloxane, wherein:
each of the first, second, third and fourth monomers contains silicon,
the first monomer includes a silylhydride group,
the second monomer includes one or more of:
  a disilane group, or
  a group having two silicon atoms bridged by a saturated hydrocarbon bridge,
the third monomer includes a chromophore,
the fourth monomer includes one or more of:
  a methyl group, or
  a hydrophilic group,
the first, third, and fourth monomers are chlorosilane monomers,
the second monomer is an alkoxysilane monomer or a chlorosilane monomer, the fourth monomer includes at least the hydrophilic group, the hydrophilic group forming part of the siloxane, and the hydrophilic group includes one or more of an aliphatic alcohol, a cycloaliphatic alcohol, an ether, or an ester.

23. A method of forming a device, comprising:
coating a composition on a substrate to form a first material layer;
forming a photoresist layer on the first material layer;
patterning the photoresist layer to expose a portion of the first material layer;
removing the exposed portion of the first material layer to expose a portion of the substrate; and
etching the exposed portion of the substrate, wherein:
the composition includes a mixture of monomeric units having structures (A), (B), and (C), and one or more of structures (D) or (E):

$$HSiO_{(3-a)/2}(OH)_a \quad (A)$$

$$SiO_{(3-b)/2}(OH)_b\text{—}(CH_2)_n\text{—}SiO_{(3-c)/2}(OH)_c \quad (B)$$

$$R1SiO_{(3-d)/2}(OH)_d \quad (C)$$

$$MeSi_{(3-e)/2}(OH)_e \quad (D)$$

$$R2SiO_{(3-f)/2}(OH)_f \quad (E)$$

wherein:
a, b, c, d, e, and f are independently from 0 to 2,
n is from 0 to about 10,
R1 is a chromophore,
R2 is a hydrophilic group,
the monomeric unit having the structure (E) is present in the mixture, and
R2 includes one or more of an aliphatic alcohol, a cycloaliphatic alcohol, an ether, or an ester.

24. A composition, comprising:
a copolymer including a mixture of monomeric units having structures (A), (B), and (C), and one or more of structures (D) or (E):

$$HSiO_{(3-a)/2}(OH)_a \quad (A)$$

$$SiO_{(3-b)/2}(OH)_b\text{—}(CH_2)_n\text{—}SiO_{(3-c)/2}(OH)_c \quad (B)$$

$$R1SiO_{(3-d)/2}(OH)_d \quad (C)$$

$$MeSiO_{(3-e)/2}(OH)_e \quad (D)$$

$$R2SiO_{(3-f)/2}(OH)_f \quad (E)$$

wherein:
a, b, c, d, e, and f are independently from 0 to 2,
n is from 0 to about 10,
R1 is a chromophore,
R2 is a hydrophilic group,
and the copolymer includes monomeric units having the structures (A), (B), (C), (D), and (E).

25. A method of forming a copolymer, comprising:
hydrolyzing and/or condensing a first monomer, a second monomer, a third monomer, and a fourth monomer to form a siloxane, wherein:
each of the first, second, third and fourth monomers contains silicon,
the first monomer includes a silylhydride group,
the second monomer includes one or more of:
  a disilane group, or
  a group having two silicon atoms bridged by a saturated hydrocarbon bridge,
the third monomer includes a chromophore,
the fourth monomer includes one or more of:
  a methyl group, or
  a hydrophilic group,
the fourth monomer includes the methyl group, and
the mixture further includes a fifth monomer having a hydrophilic group.

* * * * *